(12) United States Patent
Furuhata

(10) Patent No.: US 6,696,340 B2
(45) Date of Patent: Feb. 24, 2004

(54) SEMICONDUCTOR DEVICES HAVING A NON-VOLATILE MEMORY TRANSISTOR AND METHODS FOR MANUFACTURING THE SAME

(75) Inventor: Tomoyuki Furuhata, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 36 days.

(21) Appl. No.: 10/042,140

(22) Filed: Jan. 11, 2002

(65) Prior Publication Data

US 2002/0146883 A1 Oct. 10, 2002

(30) Foreign Application Priority Data

Jan. 11, 2001 (JP) ........................................ 2001-003959

(51) Int. Cl.[7] ........................................... H01L 21/336
(52) U.S. Cl. ..................... 438/257; 438/184; 438/197; 438/201; 438/211; 438/230; 438/364; 257/288; 257/314; 257/315; 257/350; 257/401
(58) Field of Search ................................ 438/257, 184, 438/197, 229–30, 299, 364, 201, 211; 257/900–902, 315–15, 288, 350, 401

(56) References Cited

U.S. PATENT DOCUMENTS

| 4,818,718 | A | * | 4/1989 | Kosa et al. .................... 437/52 |
| 5,041,886 | A | * | 8/1991 | Lee ............................. 257/320 |
| 5,453,388 | A | * | 9/1995 | Chen et al. .................. 438/266 |
| 5,493,138 | A | * | 2/1996 | Koh ............................. 257/314 |
| 5,617,351 | A | * | 4/1997 | Bertin et al. ............ 365/185.05 |
| 6,207,503 | B1 | * | 3/2001 | Hsieh et al. ................. 438/263 |
| 6,406,961 | B1 | * | 6/2002 | Chen ........................... 438/266 |
| 6,436,764 | B1 | * | 8/2002 | Hsieh ........................... 438/257 |
| 2001/0015455 | A1 | * | 8/2001 | Hsieh et al. ................. 257/315 |
| 2002/0042181 | A1 | * | 4/2002 | Chen ........................... 438/266 |

FOREIGN PATENT DOCUMENTS

| EP | 1096572 | * | 10/2000 | ......... H01L/29/423 |
| JP | 4-342171 | * | 11/1992 | ......... H01L/29/788 |

* cited by examiner

Primary Examiner—Matthew Smith
Assistant Examiner—Granvill D Lee, Jr.
(74) Attorney, Agent, or Firm—Konrad, Raynes & Victor, LLP; Alan S. Raynes

(57) ABSTRACT

A method for manufacturing a semiconductor device having a non-volatile memory transistor may include the steps of forming a floating gate 22 over a semiconductor layer 10 through a first insulation layer 20, forming a second insulation layer 26 that contacts the floating gate 22, forming a control gate 28 over the second insulation layer 26, forming a source region 14 and a drain region 16 in the semiconductor layer 10, depositing a insulation layer 40 over the semiconductor layer 10, and etching the insulation layer 40 to form a sidewall insulation layer, wherein the etching of the insulation layer 40 is conducted such that the insulation layer 40 remains above the floating gate 40, and the floating gate 22 is not exposed.

22 Claims, 6 Drawing Sheets

US 6,696,340 B2

SEMICONDUCTOR DEVICES HAVING A NON-VOLATILE MEMORY TRANSISTOR AND METHODS FOR MANUFACTURING THE SAME

Applicant hereby incorporates by reference Japanese Application No. 2001-003959, filed Jan. 11, 2001, in its entirety.

1. Technical Field

The present invention relates to semiconductor devices including a non-volatile memory transistor and methods for manufacturing the same.

2. Related Art

A transistor having a split-gate structure is known as one of the devices that are applied to an electrically erasable programmable ROM (EEPROM). FIG. 7 schematically shows a cross-sectional view of one example of a conventional semiconductor device including a non-volatile memory transistor. The semiconductor device includes a non-volatile memory transistor having a split-gate structure (hereafter referred to as a "memory transistor") 300.

The memory transistor 300 has, in the case of an n-type transistor as an example, a source region 14 and a drain region 16 composed of $n^+$-type impurity diffusion layers formed in a silicon substrate 10 of P-type, and a first insulation layer 70 as a gate dielectric layer formed on a surface of the silicon substrate 10. A floating gate 72, a third insulation layer 76 and a control gate 78 are successively formed on the first insulation layer 70.

A second insulation layer 74 is formed on the floating gate 72. The second insulation layer 74 is composed of an insulation layer that is formed by selectively oxidizing a part of a polysilicon layer that becomes to be the floating gate 72. In other words, the second insulation layer 72 has a structure in which the film thickness thereof becomes thinner from its center toward its end sections, as shown in FIG. 7. As a result, upper edge sections 720 of the floating gate 72 form sharp edges, such that an electric field concentration is apt to occur at the upper edge sections 720.

For operating the memory transistor with a split-gate structure 300, a channel current is flown between the source region 14 and the drain region 16 to thereby inject a charge (hot electrons) in the floating gate 72 as indicated by an arrow A10 when data is written. When data is erased, a predetermined high voltage is applied to the control gate 78 to thereby transfer the charge stored in the floating gate 72 through the third insulation layer 76 to the control gate 78 as indicated by an arrow B10 by Fowler-Nordheim tunneling conduction (FN conduction).

SUMMARY

Certain embodiments relate to a method for manufacturing a semiconductor device including a non-volatile memory transistor, the method including the steps of: (a) forming a first insulation layer that functions as a gate dielectric layer on a semiconductor layer; (b) forming a floating gate having a specified pattern on the first insulation layer; (c) forming a second insulation layer that contacts at least a part of the floating gate and functions as a tunnel dielectric layer; (d) forming a control gate having a specified pattern over the second insulation layer; (e) forming an impurity diffusion layer that forms source and drain regions in the semiconductor layer; (f) depositing an additional insulation layer on the semiconductor layer including the control gate and the floating gate; and (g) etching the additional insulation layer to form at least a first sidewall insulation layer on a side of the floating gate and a second sidewall insulation layer on a side of the control gate over the floating gate, wherein the step (g) is conducted such that a portion of the additional insulation layer remains between the first sidewall insulation layer and the second sidewall insulation layer above the floating gate, and the floating gate is not exposed.

Embodiments also relate to a method for manufacturing a semiconductor device having a non-volatile memory transistor including a MIS transistor, a floating gate and a control gate, the method for manufacturing a semiconductor device including the steps of: (a) forming a floating gate over a semiconductor layer; (b) forming a first insulation layer that functions as at least a part of a tunnel insulation layer of the non-volatile memory transistor; (c) forming a control gate over a portion above the floating gate toward a portion above the semiconductor layer; (d) forming a second insulation layer above the semiconductor layer including the non-volatile memory transistor and the MIS transistor; and (e) forming a side wall at least at the MIS transistor by conducting an etching step on the second insulation layer, wherein the etching step in the step (e) is conducted such that at least the floating gate is not exposed.

Embodiments also relate to a semiconductor device having a non-volatile memory transistor, the semiconductor device including a semiconductor layer and a floating gate disposed over the semiconductor layer through a first insulation layer as a gate dielectric layer. The device also includes a second insulation layer that contacts at least a part of the floating gate and functions as a tunnel dielectric layer. A control gate is formed over the second insulation layer. An impurity diffusion layer is formed in the semiconductor layer, which forms source and drain regions. A first sidewall insulation layer is formed on a side of the floating gate. A second sidewall insulation layer is formed on a side of the control gate above the floating gate. A third insulation layer is formed between the first sidewall insulation layer and the second sidewall insulation layer and above the floating gate, the third insulation layer being continuous to the first sidewall insulation layer and the second sidewall insulation layer.

Embodiments also relate to a method for manufacturing a semiconductor device including a non-volatile memory transistor, the method including forming a gate dielectric layer on a semiconductor layer and forming a floating gate on the gate dielectric layer. The method also includes forming an insulating layer that contacts at least a part of the floating gate, wherein at least a portion of the insulating layer acts as a tunnel dielectric layer. The method also includes forming a control gate over a portion of the insulating layer. Source and drain regions are formed in the semiconductor layer. The method also includes forming a sidewall insulating region that cover a side surface of the control gate over the floating gate and extends continuously from the side surface of the control gate to a position on a side of the floating gate.

Embodiments also relate to a semiconductor device having a non-volatile memory transistor, the semiconductor device including a semiconductor layer, a gate dielectric layer, and a floating gate disposed over the semiconductor layer and gate dielectric layer. The devise also includes an insulation layer that contacts at least a part of the floating gate and is capable of acting as a tunnel dielectric layer. The device also includes a control gate formed over at least a portion of the insulation layer, and source and drain regions in the semiconductor layer. The device also includes a sidewall insulation region extending continuously from a position on a side surface of the control gate above the floating gate to a position at a side of the floating gate.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
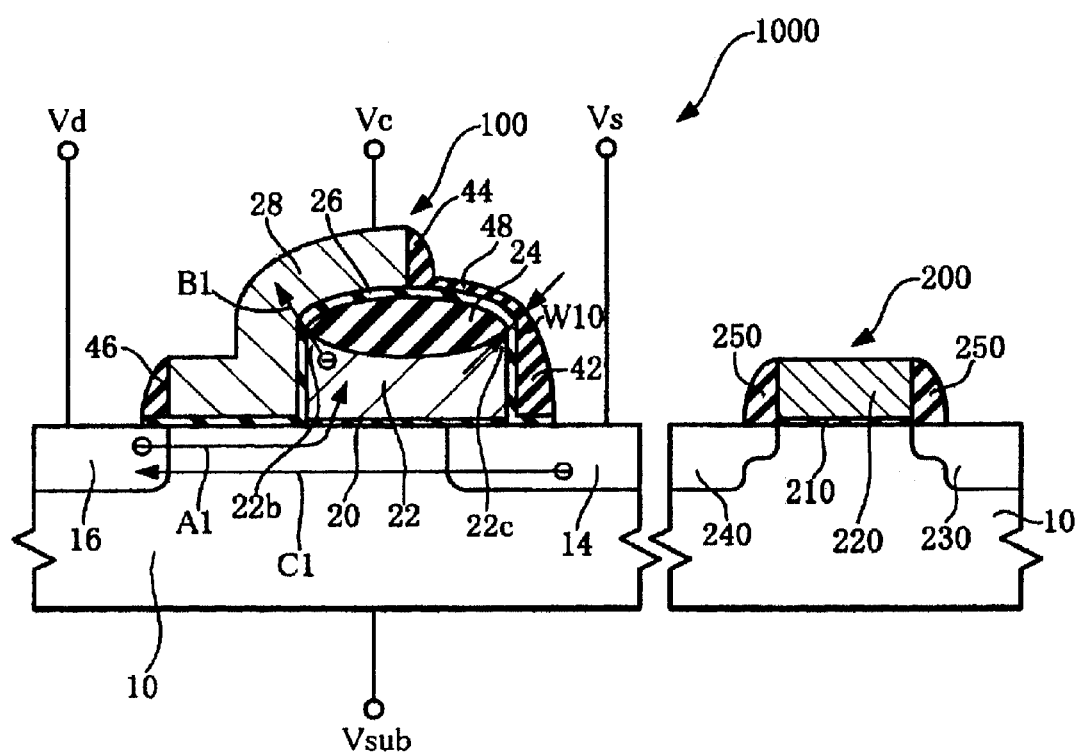
FIG. 1 schematically shows a cross-sectional view of a semiconductor device in accordance with an embodiment of the present invention.

Certain embodiments of the present invention provide semiconductor devices having a non-volatile memory transistor with an improved rewritable number characteristic, and methods for manufacturing the same.

A first method for manufacturing a semiconductor device having a non-volatile memory transistor in accordance with certain embodiments of the present invention comprises the steps of: (a) forming a first insulation layer that functions as a gate dielectric layer on a semiconductor layer; (b) forming a floating gate having a specified pattern on the first insulation layer; (c) forming a second insulation layer that contacts at least a part of the floating gate and functions as a tunnel dielectric layer; (d) forming a control gate having a specified pattern over the second insulation layer; (e) forming an impurity diffusion layer that forms a source region or a drain region in the semiconductor layer; (f) depositing an insulation layer on the semiconductor layer including the control gate and the floating gate; and (g) etching the insulation layer to form at least a first sidewall insulation layer on a side of the floating gate and a second sidewall insulation layer on a side of the control gate over the floating gate, wherein the step (g) is conducted such that the insulation layer remains between the first sidewall insulation layer and the second sidewall insulation layer above the floating gate, and the floating gate is not exposed.

In the present embodiment, the step (g) is conducted such that the insulation layer remains between the first sidewall insulation layer and the second sidewall insulation layer above the floating gate, and the floating gate is not exposed. As a result, in the step (g), process induced charge that is generated at the time of etching the insulation layer can be prevented from being charged into the floating gate. Accordingly, the charge is prevented from being trapped in the second insulation layer, and therefore the rewritable number characteristic can be improved.

The first sidewall insulation layer and the second sidewall insulation layer may preferably be continuous to one another through the remaining insulation layer.

After the step (d), the thickness of the insulation layer above a side end section of the floating gate may preferably be greater than the thickness of the second insulation layer.

In one example, the insulation layer may be etched in the step (g) by a dry etching, or in another example, the insulation layer may be etched in the step (g) by both a dry etching and a wet etching.

A second method for manufacturing a semiconductor device having a non-volatile memory transistor in accordance with certain embodiments of the present invention pertains to a method for manufacturing a semiconductor device having a non-volatile memory transistor including a MIS transistor, a floating gate and a control gate, the method comprising the steps of: (a) forming a floating gate over a semiconductor layer; (b) forming a first insulation layer that functions as at least a part of a tunnel dielectric layer of the non-volatile memory transistor; (c) forming a control gate over a portion above the floating gate toward a portion above the semiconductor layer; (d) forming a second insulation layer above the semiconductor layer including the non-volatile memory transistor and the MIS transistor; and (e) forming a side wall at least at the MIS transistor by conducting an etching step on the second insulation layer, wherein the etching step in the step (e) is conducted such that at least the floating gate is not exposed.

The etching step in the step (e) may be conducted such that at least the first insulation layer formed above the floating gate is not exposed.

The step (b) may be the same step as the step of forming the first insulation layer, which is the step of forming a gate dielectric layer of the MIS transistor.

The step (c) may be the same step as the step of forming the control gate, which is the step of forming a gate electrode of the MIS transistor.

A semiconductor device having a non-volatile memory transistor obtained by the first method for manufacturing a semiconductor device in accordance with an embodiment of the present invention may have, for example, the following structure.

A semiconductor device having a non-volatile memory transistor may comprise: a semiconductor layer; a floating gate disposed over the semiconductor layer through a first insulation layer as a gate dielectric layer; a second insulation layer that contacts at least a part of the floating gate and functions as a tunnel dielectric layer; a control gate formed over the second insulation layer; and an impurity diffusion layer formed in the semiconductor layer, which forms a source region or a drain region, wherein a first sidewall insulation layer is formed on a side of the floating gate, a second sidewall insulation layer is formed on a side of the control gate above the floating gate, and a third insulation layer is formed between the first sidewall insulation layer and the second sidewall insulation layer and above the floating gate, the third insulation layer being continuous to the first sidewall insulation layer and the second sidewall insulation layer.

The first sidewall insulation layer, the second sidewall insulation layer and the third insulation layer may be formed from the same material.

The thickness of the third insulation layer above a side end section of the floating gate may be greater than the thickness of the second insulation layer.

The semiconductor device of the present invention may be provided with another circuit region further mixed and mounted therein. The circuit region may include at least a logical circuit.

The "semiconductor layer" described above includes a semiconductor substrate and a semiconductor layer formed on a substrate.

Certain preferred embodiments of the present invention are described below with reference to the accompanying drawings.

Figure 2:
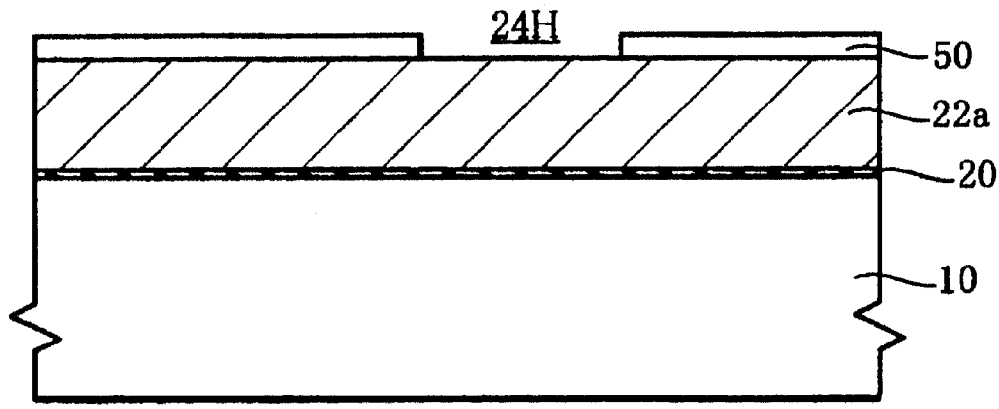
FIG. 2 shows a cross-sectional view in a manufacturing step of a semiconductor device in accordance with an embodiment of the present invention.
Figure 2:
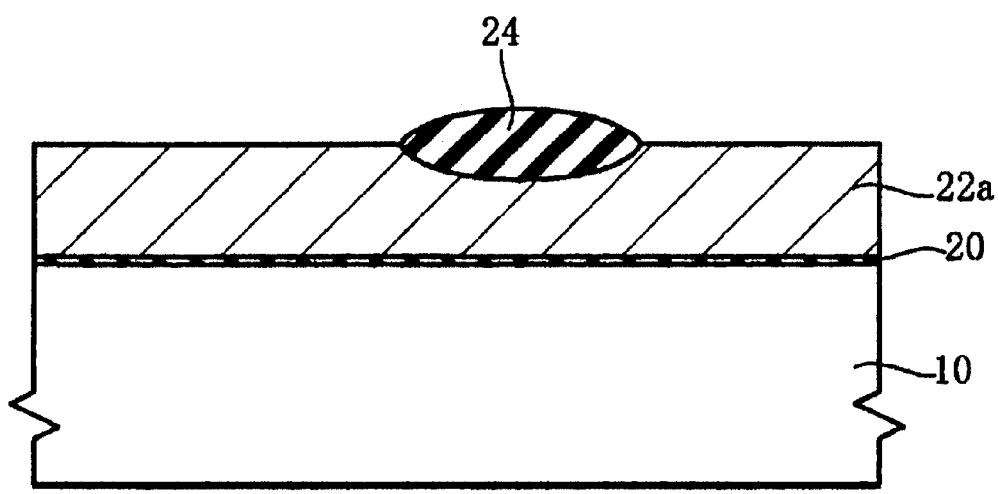

A method for manufacturing a semiconductor device in accordance with certain embodiments of the present invention is described. First, as shown in FIG. 2(a), a silicon oxide layer (first insulation layer) 20 is formed on a surface of the silicon substrate 10 by a thermal oxidation method. The silicon oxide layer 20 is not limited to a specific thickness, but may preferably have a thickness of 7–9 nm in view of the gate dielectric strength, the data retaining characteristic and the like.

Then, a polysilicon layer (conduction layer) 22a is formed on a surface of the silicon oxide layer 20, and phosphorous or arsenic is diffused therein to form an n-type polysilicon layer 22a. The method for forming the polysilicon layer 22a is not particularly limited, and a CVD method may be used. The polysilicon layer 22a may preferably have a thickness of, for example, 50–300 nm, and more preferably, 100–200 nm.

The polysilicon layer 22a may be changed to n-type by other methods. For example, after the polysilicon layer 22a is formed, phosphorous ions or arsenic ions are implanted therein. Alternatively, after the polysilicon layer 22a is formed, it is contacted with a carrier gas containing phosphoryl chloride ($POCl_3$). Alternatively, when the polysilicon layer 22a is formed, it is contacted with a carrier gas containing phosphine ($PH_3$).

Then, a silicon nitride layer 50 is formed on a surface of the polysilicon layer 22a by, for example, a CVD method. Next, using a lithography technique, specified regions of the silicon nitride layer 50 are selectively etched and removed. A region 24H of the silicon nitride layer 50 that is removed is a region where a fourth insulation layer 24 of the memory transistor 100 is formed.

Next, as shown in FIG. 2(b), an exposed portion of the polysilicon layer 22a is selectively oxidized to form the fourth insulation layer 24 on a surface of the polysilicon layer 22a in a specified region thereof. The fourth insulation layer 24 formed by the selective oxidation has a structure in which it has a maximum film thickness at its central area, and gradually becomes thinner toward end sections thereof. Thereafter, the silicon nitride layer 50 is removed.

Figure 3:
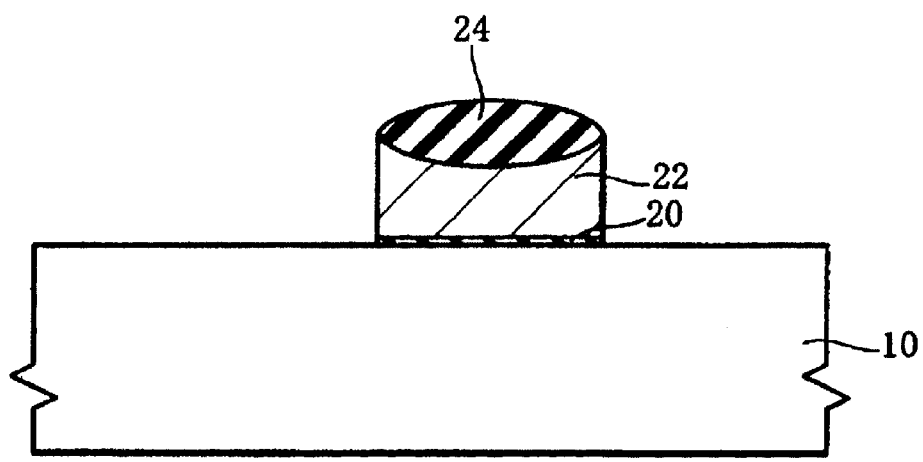
FIG. 3 shows a cross-sectional view in a manufacturing step of a semiconductor device in accordance with an embodiment of the present invention.
Figure 3:
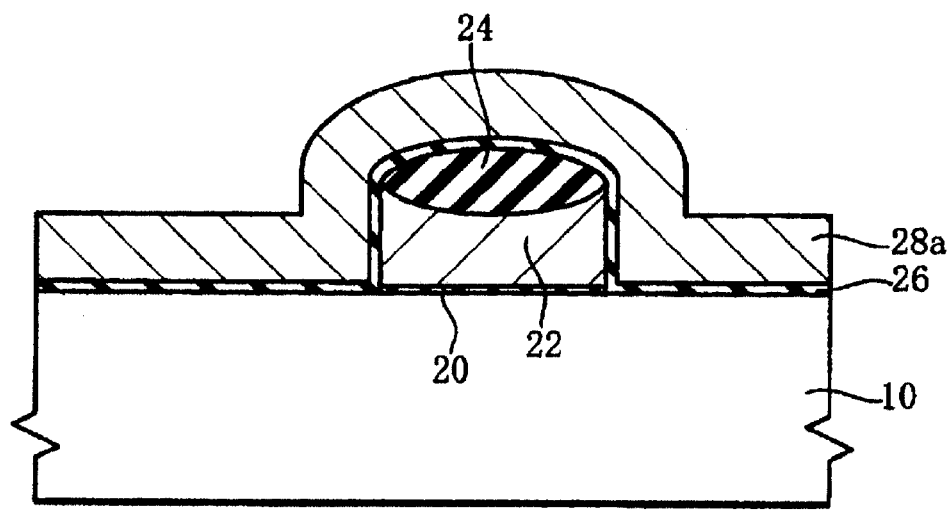

Then, as shown in FIG. 3(a), an etching is conducted using the fourth insulation layer 24 as a mask to pattern the polysilicon layer 22a, to thereby form a floating gate 22. Further, a non-masked portion of the silicon oxide layer 20 on the silicon substrate 10 is removed.

Next, as shown in FIG. 3(b), a silicon oxide layer (second insulation layer) 26 is deposited on the silicon substrate 10. The thickness of the silicon oxide layer 26 is, for example, 20–25 nm measured from the upper surface of the silicon substrate 10 as a reference. The silicon oxide layer 26 may be formed by any method, for example, a thermal oxidation method, or a CVD method. A preferred CVD method is a high-temperature CVD method (for example, a silane-base high-temperature CVD method). Forming the silicon oxide layer 26 by a high-temperature CVD method provides an advantage in that the film quality of the silicon oxide layer 26 becomes dense.

Also, the silicon oxide layer 26 may be formed from a plurality of layers stacked in layers. More specifically, the silicon oxide layer 26 may have a stacked layered structure including a first silicon oxide layer obtained by a thermal oxidation method and a second silicon oxide layer obtained by a CVD method. Further, it may have a three-layer stacked structure including a thermal oxidation film, a CVD film and a thermal oxidation film.

Next, a polysilicon layer 28a is formed on a surface of the silicon oxide layer 26. The polysilicon layer 28a may be formed by any method, for example, by a CVD method. The polysilicon layer 28a can be changed to n-type by the same method conducted for the polysilicon layer 22a described above. The film thickness of the polysilicon layer 28a is, for example, 50–300 nm.

Next, a silicide layer may be formed on the polysilicon layer 28a depending on the desired requirements. The silicide layer, if used, may be formed by, for example, a sputtering method or a CVD method.

Next, a resist layer having a specified pattern is formed on the control gate 28. Then, the polysilicon layer 28a is patterned by an etching to form the control gate 28, as shown in FIG. 4(a).

Next, an n-type impurity is doped in the silicon substrate 10 by a known method to thereby form a source region 14 and a drain region 16. The steps described above form the memory transistor 100.

Figure 4:
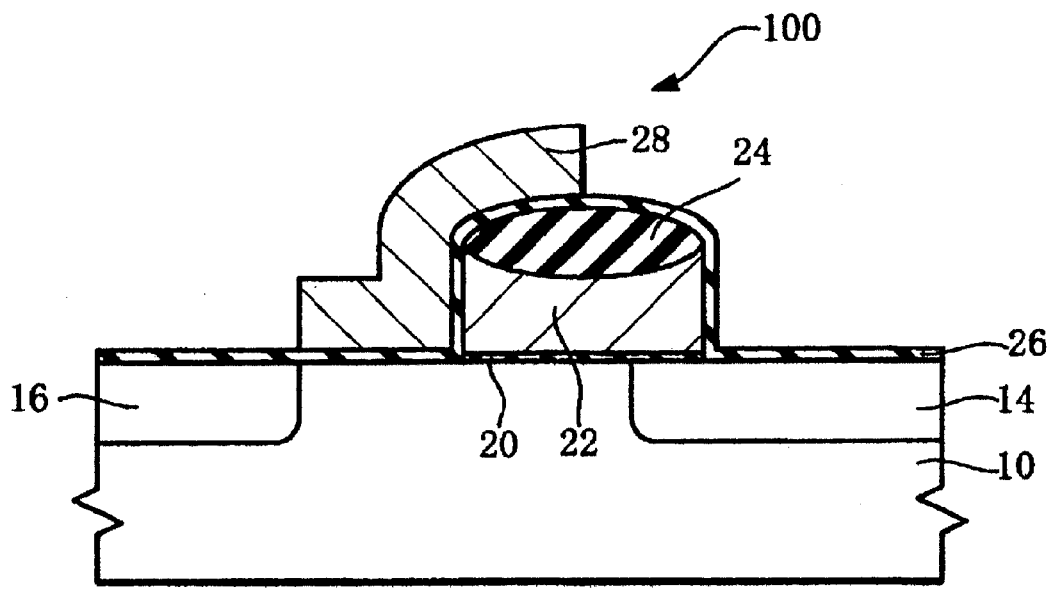
FIG. 4 shows a cross-sectional view in a manufacturing step of a semiconductor device in accordance with an embodiment of the present invention.
Figure 4:
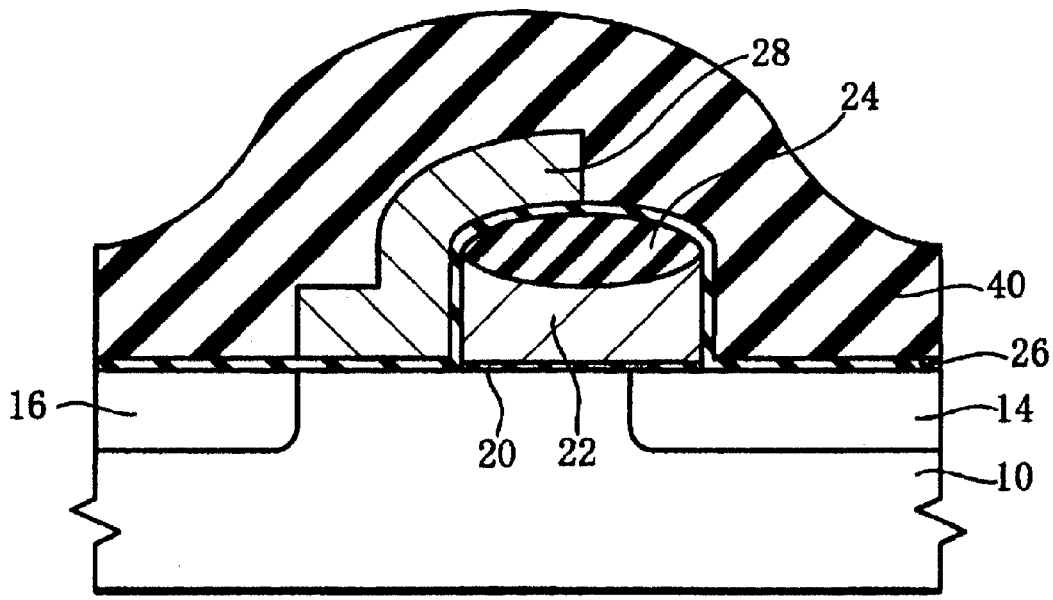

Next, as shown in FIG. 4(b), an insulation layer 40 may be formed on the entire surface. The material for the insulation layer 40 may be silicon oxide, or silicon nitride. The insulation layer 40 can be formed by, for example, a CVD method.

Next, the insulation layer 40 may be dry-etched to form a first sidewall insulation layer 42 on a side wall of the floating gate 22, a second sidewall insulation layer 44 on a side wall of the control gate 28 above the floating gate 22, and a third sidewall insulation layer 46 on a side wall of the control gate 28 at an end section of the drain region 16. An example of such a structure is illustrated in FIG. 1. It is noted that a sidewall insulation layer 250 of the MIS transistor 200 is preferably formed in the same step wherein the first through third sidewall insulation layers 42, 44 and 46 are formed.

It is noted that the etching of the insulation layer 40 is preferably conducted such that the floating gate 22 is not exposed. More specifically, the step for etching the insulation layer 40 is preferably conducted such that the insulation layer 40 remains above the floating gate 22 between the first sidewall insulation layer 42 and the second sidewall insulation layer 44 (above the fourth insulation layer 24 that is not covered by the control gate 28) to thereby form a third insulation layer 48. Since the insulation layer 40 is etched in a manner that the floating gate 22 is not exposed, process induced charge that is generated during the etching is prevented or inhibited from being injected to the floating gate 22. The thickness W10 of the third insulation layer 48 at an upper portion 22c of the side end section of the floating gate 22 may be greater than, for example, the thickness of the second insulation layer 26, and more specifically, 1–10 nm, and more preferably 1–5 nm.

Also, the insulation layer 40 may be etched by a dry etching and a wet etching combined. As the wet etching being combined, the generation of process induced charge is accordingly suppressed at the time of etching. Also, the film thickness of the third insulation layer 48 can be controlled by controlling the time duration of etching of the insulation layer 40. The dry etching may preferably be conducted by an anisotropic reactive ion etching. A preferred wet etching example includes a wet etching using diluted hydrofluoric acid or diluted ammonium fluoride as an etchant.

Methods for manufacturing a semiconductor device in accordance with certain embodiments may include one or more of the following effects.

Figure 5:
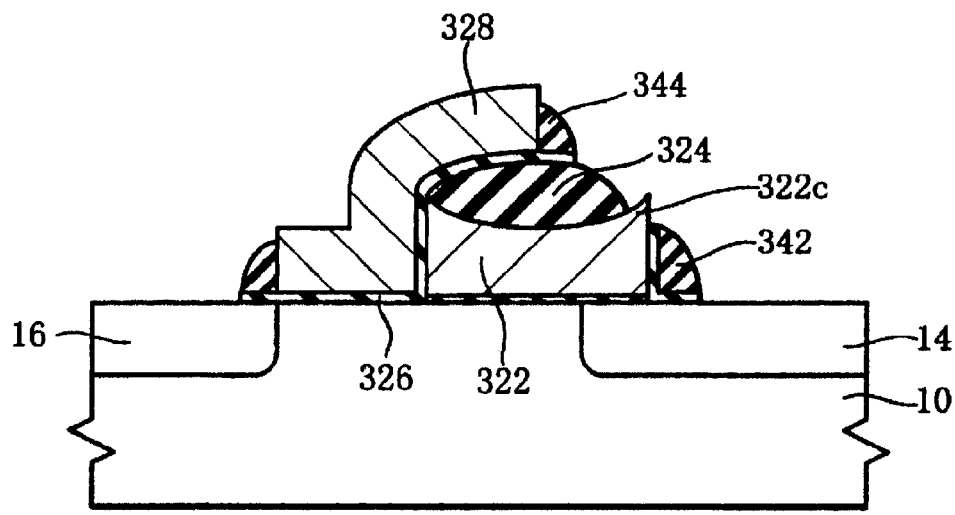
FIG. 5 schematically shows a cross-sectional view of a semiconductor device of a comparison example, which is used to described the effects of the method for manufacturing a semiconductor device in accordance with an embodiment of the present invention.

Let one consider the case where sidewall insulation layers 342, 344 and 346 are formed in a manner that any insulation layer does not remain on a fourth insulation layer 324 between the first sidewall insulation layer 324 and the second sidewall insulation layer 344, as shown in FIG. 5. However, when the insulation layer does not remain on the fourth insulation layer 324, there may be an occasion in which an upper section 322c of a side end section of the floating gate 322 is exposed, as shown in FIG. 5. When an etching is conducted with the upper section 322c of the side end section of the floating gate 322 being exposed, the rewritable number characteristic (endurance characteristic) lowers. The reason for this is considered to be as follows. When the insulation layer is etched, process induced charge is generated. When the etching of the insulation layer is continued with the upper section 322c of the side end section of the floating gate 322 being exposed, the charge is injected in the floating gate 322 through a portion where the floating gate is exposed. When the charge is injected in the floating gate 322, a part of the charge is further injected toward the second insulation layer 326, and trapped in the second insulation layer 326. As a result, the rewriting capability number (endurance characteristic) is lowered However, in accordance with certain embodiments, at the time of etching the insulation layer 40 to form the sidewall insulation layers 42, 44 and 46, the insulation layer 40 remains on the forth insulation layer 24 that is not covered by the control gate 28 to thereby form the third insulation layer 48. The third insulation layer 48 continues to the first sidewall insulation layer 42 and the second sidewall insulation layer 44. As a result, the upper section 22c of the side end section of the floating gate 22 is not exposed. Accordingly, process induced charge generated at the time of etching the insulation layer 40 can be inhibited or prevented from being injected in the floating gate 22. As a consequence, the charge is inhibited or prevented from being trapped in the second insulation layer 26, and therefore the rewriting capability number (endurance characteristic) can be improved.

A semiconductor device in accordance with one embodiment of the present invention is described. FIG. 1 schematically shows a cross-sectional view of a semiconductor device in accordance with the present embodiment.

A semiconductor device 1000 includes a non-volatile memory transistor (hereafter referred to as a "memory transistor") 100 and a MIS transistor 200. The memory transistor 100 includes a source region 14, a drain region 16 and a first insulation layer 20 that functions as a gate dielectric layer. The source region 14 and the drain region 16 are composed of $n^+$-type impurity diffusion layers formed in a P-type silicon substrate 10, in the case of an n-type transistor as an example. The first insulation layer 20 is formed on a surface of the silicon substrate 10.

A floating gate 22 and a fourth insulation layer 24 are successively formed on the first insulation layer 20. The fourth insulation layer 24 has a structure in which the thickness thereof becomes thinner from its center toward its end sections. As a consequence, an upper section 22b of side end section of the floating gate 22 forms a sharp edge. As a result, an electric field concentration is apt to occur at the upper section 22b of the side end section 22b of the floating gate 22.

A second insulation layer 26 is formed in a manner to cover an upper surface of the fourth insulation layer 24, a side surface of the floating gate 22 and a surface of the silicon substrate 10. The second insulation layer 26 functions as a so-called tunneling dielectric layer.

A control gate 28 is formed on an upper surface of the second insulation layer 26. A silicide layer may be formed on the control gate 28, if desired, depending on the requirements. For example, tungsten silicide, molybdenum silicide, titanium silicide, and cobalt silicide are examples of materials that may be used for the silicide layer.

A first sidewall insulation layer 42 is formed on a side wall of the floating gate 22. A second sidewall insulation layer 44 is formed on a side wall of the control gate 28 above the floating gate 22. A third insulation layer 46 is formed between the first sidewall insulation layer 42 and the second sidewall insulation layer 44 (on the fourth insulation layer 24 that is not covered by the control gate 20). The third insulation layer 48 preferably continues to the first sidewall insulation layer 42 and the second sidewall insulation layer 44. In other words, the first sidewall insulation layer 42 and the second sidewall insulation layer 44 are preferably continuous to one another through the third insulation layer 48.

Also, a third sidewall insulation layer 46 is formed on a side wall of the control gate 28 at an end of the drain region 16.

The MIS transistor 200 includes a gate dielectric layer 210, a gate electrode 220, a source region 230 and a drain region 240. A sidewall insulation layer 250 is formed on a side wall of the gate electrode 220.

Also, a part of the process of manufacturing the MIS transistor 200 can be commonly shared with the process of manufacturing the memory transistor 100. Referring to FIG. 1, the gate dielectric layer 210 of the MIS transistor can be formed in the same step in which the second insulation layer 26 of the memory transistor 100 is formed. For example, when the second insulation layer 26 of the memory transistor 100 is formed from a three-layer structure including a thermal oxidation film, a high temperature oxidation film (HTO film) and a thermal oxidation film, the upper thermal oxidation film and the gate dielectric layer 210 of the MIS transistor 200 can be formed in the same step. Also, the control gate 28 of the memory transistor 100 and the gate electrode 220 of the MIS transistor 200 can be formed in the same step.

Next, one example method for operating the memory transistor 100 that comprises a semiconductor device in accordance with an embodiment of the present invention will be described with reference to FIG. 1.

Referring to FIG. 1, Vc indicates a voltage applied to the control gate 28, Vs indicates a voltage applied to the source region 14, Vd indicates a voltage applied to the drain region 16, and Vsub indicates a voltage applied to the P-type silicon substrate 10.

For the operation of the memory transistor 100, a channel current is flown between the source region 14 and the drain region 16 to thereby inject a charge (hot electrons) in the floating gate 22 when data is written. When data is erased, a predetermined high voltage is applied to the control gate 28 to thereby transfer the charge stored in the floating gate 22 to the control gate 28 by FN conduction. Each of the operations in one example will be described below.

First, the data-writing operation will be described. It is noted that an arrow A1 indicates a flow of electrons at the time of writing.

For the data-writing operation, the source region 14 is set at a higher potential than the drain region 16, and a specified potential is applied to the control gate 28 depending on the requirements. As a result, hot electrons that are generated near the drain region 16 are accelerated toward the floating gate 22, and injected in the floating gate 22 through the first insulation layer 20 whereby data is written.

In the data-writing operation, for example, the control gate 28 is set at a potential (Vc) of 2 V, the source region 14 is set at a potential (Vs) of 10.5 V, and the drain region 16 is set at a potential (Vd) of 0.8 V. Also, the silicon substrate 10 is set at a potential (Vsub) of 0 V.

Next, the data-erasing operation will be described. It is noted that an arrow B1 indicates a flow of electrons at the time of erasing.

For the data-erasing operation, the control gate 28 is set at a potential higher than the potential of the source region 14 and the drain region 16. As a result, the charge stored in the floating gate 22 is discharged from the upper section 22b of the side end section of the floating gate 22, passing through the second insulation layer 26, to the control gate 28 due to FN conduction, whereby the data is erased.

In the data-erasing operation, for example, the control gate 28 is set at a potential (Vc) of 11.5 V, the source region 14 and the drain region 16 are set at a potential (Vs) and (Vd) of 0 V, respectively. The silicon substrate 10 is set at a potential (Vsub) of 0 V.

Next, the data-reading operation will be described. It is noted that an arrow C1 indicates a flow of electrons at the time of reading.

For the data-reading operation, the drain region 16 is set at a higher potential than the source region 14, and a predetermined potential is applied to the control gate 23, whereby a determination can be made as to written data based on the presence or the absence of a formed channel. More specifically, when a charge is injected in the floating gate 22, the potential of the floating gate 22 becomes low, with the result that a channel is not formed and a drain current does not flow. Conversely, when the floating gate 22 is not injected with a charge, the floating gate 22 has a high potential, with the result that a channel is formed and a drain current flows. By detecting a current flowing from the drain region 16 by a sense amplifier, data in the memory transistor 100 can be read out.

In the data-reading operation, for example, the control gate 28 is set at a potential (Vc) of 3.0 V, the source region 14 is set at a potential (Vs) of 0 V, and the drain region 16 is set at a potential (Vd) of 1 V. The silicon substrate 10 is set at a potential (Vsub) of 0 V.

The semiconductor device may include other circuit regions. The other circuit regions may include a logical circuit, an interface circuit, a gate array circuit, a memory circuit (for example, RAM and ROM), circuits such as a processor (for example, RISC) or a variety of IP (Intellectual Property) macros, or other digital circuits and analog circuits.

Figure 6:
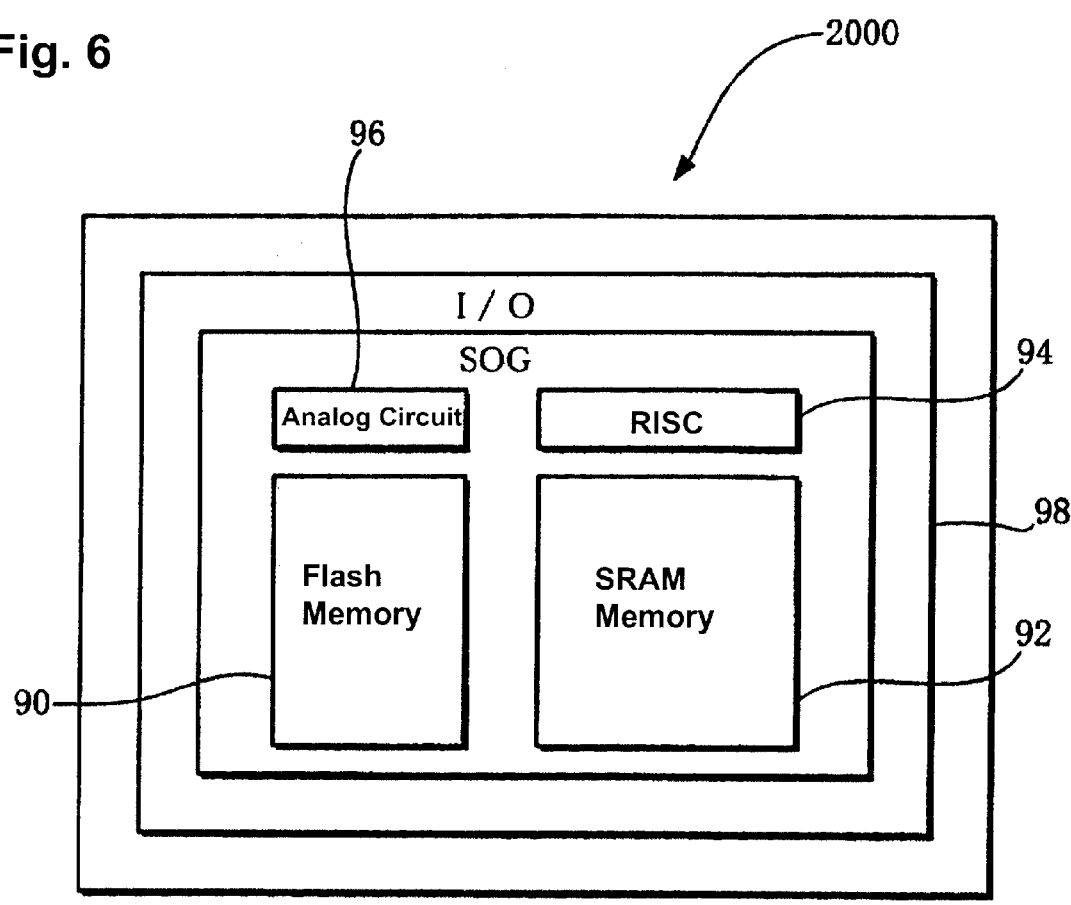
FIG. 6 schematically shows a layout of an embedded semiconductor device in which the semiconductor device in accordance with an present embodiment is implemented.
Figure 7:
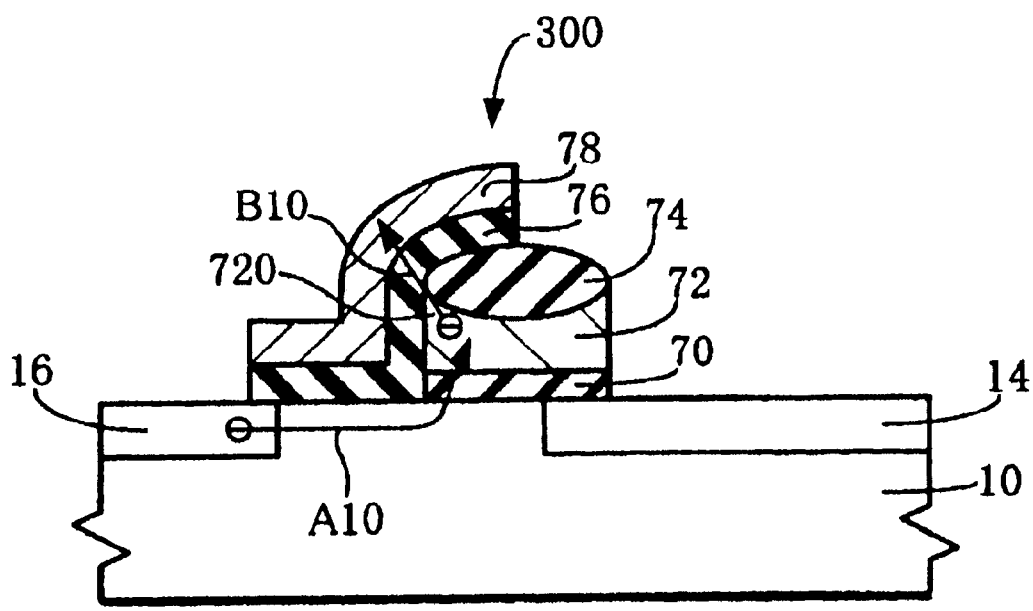
FIG. 7 schematically shows a cross-sectional view of a conventional example of a semiconductor device including a non-volatile memory transistor.

More specifically, the following embedded semiconductor device is possible. FIG. 6 schematically shows a layout of an embedded semiconductor device in which a semiconductor device of an embodiment described above is implemented. In this example, the embedded semiconductor device 2000 includes a flash-memory 90, an SRAM memory 92, a RISC 94, an analog circuit 96 and an interface circuit 98 that are mixed and mounted in an SOG (sea of gates) structure. The memory transistor 100 is a component of the flash memory 90. The MIS transistor 200 can be a component of a peripheral circuit of the flash memory 90. Also, the MIS transistor 200 can be a component in a circuit region other than the above-described circuit regions.

The present invention is not limited to the embodiments described above, and many modifications can be made without departing the scope of the subject matter of the present invention.

What is claimed:

1. A method for manufacturing a semiconductor device including a non-volatile memory transistor, the method comprising the steps of:
    (a) forming a first insulation layer that functions as a gate dielectric layer on a semiconductor layer;
    (b) forming a floating gate on the first insulation layer;
    (c) forming a second insulation layer that contacts at least a part of the floating gate and functions as a tunnel dielectric layer;
    (d) forming a control gate over the second insulation layer;
    (e) forming an impurity diffusion layer that forms source and drain regions in the semiconductor layer;
    (f) depositing an additional insulation layer above the semiconductor layer; and
    (g) etching the additional insulation layer to form at least a first sidewall insulation layer on a side of the floating gate and a second sidewall insulation layer on a side of the control gate over the floating gate,
        wherein the step (g) is conducted such that a portion of the additional insulation layer remains between the first sidewall insulation layer and the second sidewall insulation layer above the floating gate.

2. A method for manufacturing a semiconductor device having a non-volatile memory transistor according to claim 1, wherein the first sidewall insulation layer and the second sidewall insulation layer are continuous to one another through the portion of the additional insulation layer that remains between the first sidewall insulation layer and the second sidewall insulation layer.

3. A method for manufacturing a semiconductor device having a non-volatile memory transistor according to claim 1, wherein, after the step (d), the thickness of the insulation layer above a side end section of the floating gate is formed to be greater than the thickness of the second insulation layer.

4. A method for manufacturing a semiconductor device having a non-volatile memory transistor according to claim 1, wherein the insulation layer is etched in the step (g) by a dry etching.

5. A method for manufacturing a semiconductor device having a non-volatile memory transistor according to claim 1, wherein the insulation layer is etched in the step (g) by a dry etching and a wet etching combined.

6. A method for manufacturing a semiconductor device having a non-volatile memory transistor including a MIS transistor, a floating gate and a control gate, the method for manufacturing a semiconductor device comprising the steps of:
    (a) forming a floating gate over a semiconductor layer;
    (b) forming a first insulation layer that functions as at least a part of a tunnel insulation layer of the non-volatile memory transistor;
    (c) forming a control gate that extends from a position over a portion of the floating gate to a position over a portion of the semiconductor layer a distance away from the floating gate;
    (d) forming a second insulation layer above the semiconductor layer; and
    (e) forming a side wall at least at the MIS transistor by conducting an etching step on the second insulation layer, wherein the etching step in the step (e) is conducted such that at least the floating gate is not exposed.

7. A method for manufacturing a semiconductor device having a non-volatile memory transistor according to claim 6, wherein the etching step in the step (e) is conducted such that at least the first insulation layer formed above the floating gate is not exposed.

8. A method for manufacturing a semiconductor device having a non-volatile memory transistor according to claim 6, further comprising forming a gate dielectric layer of the MIS transistor, wherein the gate dielectric layer of the MIS transistor and at least a portion of the first insulation layer are formed in the same processing step.

9. A method for manufacturing a semiconductor device having a non-volatile memory transistor according to claim 6, further comprising forming a gate electrode of the MIS transistor, wherein the gate electrode of the MIS transistor and the control gate are formed in the same processing step.

10. A semiconductor device having a non-volatile memory transistor, the semiconductor device comprising:
    a semiconductor layer;
    a floating gate disposed over the semiconductor layer through a first insulation layer as a gate dielectric layer;
    a second insulation layer that contacts at least a part of the floating gate and functions as a tunnel dielectric layer;
    a control gate formed over the second insulation layer; and
    an impurity diffusion layer formed in the semiconductor layer, which forms source and drain regions,
    wherein a first sidewall insulation layer is formed on a side of the floating gate,
    a second sidewall insulation layer is formed on a side of the control gate above the floating gate, and
    a third insulation layer is formed between the first sidewall insulation layer and the second sidewall insulation layer and above the floating gate, the third insulation layer being continuous to the first sidewall insulation layer and the second sidewall insulation layer.

11. A semiconductor device having a non-volatile memory transistor according to claim 10, wherein the first sidewall insulation layer, the second sidewall insulation layer and the third insulation layer are formed from an identical material.

12. A semiconductor device having a non-volatile memory transistor according to claim 10, wherein the thickness of the third insulation layer above a side end section of the floating gate is greater than the thickness of the second insulation layer.

13. A semiconductor device having a non-volatile memory transistor according to claim 10, wherein another circuit region is further mixed and mounted on the semiconductor layer.

14. A semiconductor device having a non-volatile memory transistor according to claim 13, wherein the circuit region includes at least a logic circuit.

15. A semiconductor device as in claim 10, wherein the second insulation layer extends along an upper surface and side surfaces of the floating gate, and the second insulation layer is positioned between the floating gate and the first sidewall insulation layer.

16. A method for manufacturing a semiconductor device having a non-volatile memory transistor according to claim 1, wherein the a portion of the second insulation layer is positioned between the floating gate and the first sidewall insulation layer.

17. A method for manufacturing a semiconductor device including a non-volatile memory transistor, the method comprising:
    forming a gate dielectric layer on a semiconductor layer;
    forming a floating gate on the gate dielectric layer;
    forming an insulating layer that contacts at least a part of the floating gate, wherein at least a portion of the insulating layer acts as a tunnel dielectric layer;
    forming a control gate over a portion of the insulating layer;
    forming source and drain regions in the semiconductor layer;
    forming a sidewall insulating region that cover a side surface of the control gate over the floating gate and extends continuously from the side surface of the control gate to a position on a side of the floating gate.

18. A method for manufacturing a semiconductor device including a non-volatile memory transistor as in claim 17, wherein the insulating layer is formed to include a region that is positioned between the floating gate and the sidewall insulating region on the side of the floating gate.

19. A method for manufacturing a semiconductor device including a non-volatile memory transistor as in claim 18, wherein the insulating layer is formed to extend over the floating gate and to contact a surface of the semiconductor layer.

20. A semiconductor device having a non-volatile memory transistor, the semiconductor device comprising:
    a semiconductor layer;
    a gate dielectric layer;
    a floating gate disposed over the semiconductor layer and gate dielectric layer;
    an insulation layer that contacts at least a part of the floating gate and is capable of acting as a tunnel dielectric layer;
    a control gate formed over at least a portion of the insulation layer;
    source and drain regions in the semiconductor layer; and
    a sidewall insulation region extending continuously from a position on a side surface of the control gate above the floating gate to a position at a side of the floating gate.

21. A semiconductor device having a non-volatile memory transistor as in claim 20, wherein the a portion of the insulation layer is positioned between the sidewall insulation region and the floating gate.

22. A semiconductor device according to claim 20, wherein the insulation layer that contacts at least a part of the floating gate is also positioned under the sidewall insulation region where the sidewall insulation region extends above the floating gate.

* * * * *